United States Patent
Yamashita

(10) Patent No.: US 6,838,386 B2
(45) Date of Patent: Jan. 4, 2005

(54) METHOD FOR PRECISION-PROCESSING A FINE STRUCTURE

(75) Inventor: Ichiro Yamashita, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 283 days.

(21) Appl. No.: 10/168,201
(22) PCT Filed: Mar. 16, 2001
(86) PCT No.: PCT/JP01/02140
§ 371 (c)(1),
(2), (4) Date: Jun. 19, 2002
(87) PCT Pub. No.: WO01/68513
PCT Pub. Date: Sep. 20, 2001

(65) Prior Publication Data
US 2002/0192968 A1 Dec. 19, 2002

(30) Foreign Application Priority Data
Mar. 16, 2000 (JP) ........................... 2000-073806

(51) Int. Cl.[7] ............................................ H01L 21/302
(52) U.S. Cl. ...................... 438/706; 438/710; 438/717; 216/49
(58) Field of Search ................................. 438/706, 710, 438/712, 717, 725; 216/40, 41, 47, 49

(56) References Cited

U.S. PATENT DOCUMENTS 4,103,064 A * 7/1978 McAlear et al. ............ 428/333
6,121,075 A * 9/2000 Yamashita .................. 438/149

FOREIGN PATENT DOCUMENTS

| EP | 881691 | 12/1998 |
|---|---|---|
| EP | 926260 | 6/1999 |
| JP | 08083940 | 3/1996 |
| JP | 11-45990 | 2/1999 |
| JP | 11-204774 | 7/1999 |
| JP | 11-233752 | 8/1999 |
| WO | WO 98/22942 | 5/1998 |
| WO | 99/21652 | 5/1999 |

OTHER PUBLICATIONS

International Search Report—PCT/JP01/02140, ISA/JPO, Jun. 26, 2001.

International Preliminary Examination Report—PCT/JP01/02140, IPEA/JPO.

* cited by examiner

Primary Examiner—Lan Vinh
(74) Attorney, Agent, or Firm—Harness, Dickey & Pierce, P.L.C.

(57) ABSTRACT

A two-dimensional crystalline film of ferritin 4 holding iron-oxide cores 1 is formed on a silicon substrate 6. The silicon substrate 6 is then etched by using at least the cores 1 as an etching mask. Since the cores 1 have a small diameter of 6 nm, a fine structure can be formed on the substrate, enabling manufacturing of a semiconductor light-emitting element and various semiconductor devices using a quantum effect.

1 Claim, 11 Drawing Sheets

METHOD FOR PRECISION-PROCESSING A FINE STRUCTURE

TECHNICAL FIELD

The present invention relates to a method for precision-processing a fine structure. More particularly, the present invention relates to a method capable of productively forming uniform, ultrafine structures with a size of about several tens of micrometers on the industrial scale.

BACKGROUND ART

Currently, the electronics industry sees a rapid progress of semiconductor devices. Integration of the elements is improved as the dimensions of the semiconductor devices are reduced. Accordingly, various efforts have been made to fabricate ultrafine devices.

Conventionally, fabrication of submicron devices is implemented by downsizing the normal transistors. This downsizing is based on the lithography technology.

More specifically, a resist film, which is capable of being modified by light, X-rays, electron beams or the like, is applied to a substrate. A reticle (photomask) having an appropriate pattern is then placed thereon. Light, X-rays, electron beams or the like is radiated through the reticle in order to modify the resist film. Either the modified or unmodified resist film is then removed to form a resist pattern on the substrate.

On the other hand, the semiconductor industry shows the possibilities of a quantum effect element in a semiconductor region having a size of several tens of nanometers because of its excellent functionality. Accordingly, establishment of the processing technology for forming ultrafine structures with a size of several tens of nanometers or less has been demanded in the semiconductor industry.

However, there is a limit in the lithography technology in terms of accuracy for the following reasons: photomask alignment error cannot be eliminated; there is a limit in the technology of reducing the mask size; and a resist material is not capable of being modified in a satisfactory manner by light or the like. Accordingly, the lithography technology is problematic in forming fine structures having a size of several tens of nanometers.

Various efforts have been made to solve the above problems like using the self-alignment technology to minimize the use of the lithography process. However, even these methods do not completely solve the problems in forming the uniform, fine structures.

Problems

Accordingly, it is a prime task in the field of ultrafine semiconductor devices with a size of several tens of nanometers or less to develop a method capable of accurately processing a fine structure in a manner suitable for mass production, which is heretofore impossible. For practical applications of the semiconductor devices, the produced fine structures are required to have a uniform size.

The present invention is made to solve the above problems, and it is an object of the present invention to propose a method capable of accurately processing a fine structure in a manner suitable for mass production.

DISCLOSURE OF THE INVENTION

It is an object of the present invention to provide a method for accurately processing a fine structure in a manner suitable for mass production in the field of ultrafine semiconductor devices with a size of several tens of nanometers or less.

According to a first aspect of the present invention, a method for precision-processing a fine structure includes the steps of: (a) arranging organic molecules on a substrate, the organic molecules each holding a fine particle in a holding portion capable of holding a fine particle therein; and (b) etching the substrate by using at least the fine particles as an etching mask.

Since the substrate can be etched by using the fine particles arranged on the substrate as a mask, fine structures having the same size as that of the organic molecules or fine particles can be formed. The fine structures thus obtained go beyond the limit of the lithography technology.

In the above method of the first aspect of the present invention, the organic molecules may include a protein, and the fine particles may include an inorganic substance. This enables the organic molecules to be easily removed while leaving the inorganic substance on the substrate in the step of removing the organic molecules described below.

Preferably, the above method of the first aspect of the present invention further includes the step of removing the organic molecules to leave the fine particles on the substrate, and the removing step is conducted between the steps (a) and (b). In the step (b), etching is preferably conducted by using the fine particles as an etching mask.

Since the fine particles smaller than the organic molecules can be used as an etching mask, finer structures can be formed on the substrate.

In the above method of the first aspect of the present invention, the organic molecules may be ferritin. In this case, the organic molecules holding fine particles of a uniform size can be arranged and fixed on the substrate, enabling formation of uniform fine structures with a high density. This also facilitates positional control of the fine structures.

The above method of the first aspect of the present invention may further include the step of (a') causing the organic molecules to hold the fine particles in a liquid, and the step (a') is conducted before the step (a). This ensures that the organic molecules hold the fine particles with a desired size. As a result, a desired pattern can be formed in a satisfactory manner.

In the above method of the first aspect of the present invention, the organic molecules before holding the fine particles may be apoferritin.

This facilitates control of introduction of the fine particles into apoferritin, whereby the concentration of the fine particles to be applied to the liquid in the subsequent step (a') can be held at an appropriate value.

In the above method of the first aspect of the present invention, the number of moles of atoms of the fine particles contained in the liquid is preferably in the range from the maximum number of moles of the atoms of the fine particles that can be held by the apoferritin contained in the liquid to ten times the maximum number of moles.

This suppresses production of by-products in the step (a'), whereby apoferritin holding the fine particles can be obtained at a high purity.

In the above method of the first aspect of the present invention, the number of moles of atoms of the fine particles contained in the liquid is more preferably in the range from the maximum number of moles of the atoms of the fine particles that can be held by the apoferritin contained in the liquid to twice the maximum number of moles.

This suppresses production of by-products in the step (a') in a more effective manner, whereby apoferritin holding the fine particles can be obtained at a higher purity.

In the above method of the first aspect of the present invention, the organic molecules may be bacterial flagellar filaments, and the fine particles may be a bar-shaped substance.

This enables fine, bar-shaped structures to be formed in the step (b).

In the above method of the first aspect of the present invention, precision processing of the substrate may be conducted by a method selected from ion reactive etching, X-ray radiation, corpuscular radiation, electron beam radiation and plasma radiation. In this case, the substrate is effectively etched, enabling formation of fine particles.

According to a second aspect of the present invention, a method for precision-processing a fine structure includes the steps of: (a) forming a resist film on a substrate; (b) arranging organic molecules on the resist film on the substrate, the organic molecules each holding a fine particle in a holding portion capable of holding a fine particle therein; (c) patterning the resist film by using at least the fine particles as a mask to form a resist pattern; and (d) etching the substrate by using the resist pattern as a mask.

Since the fine particles, organic molecules or the like can be used as a resist mask, etching the substrate according to the resist pattern enables fine structures to be formed on the substrate. Moreover, it is possible to etch the substrate even if the fine particles are not capable of serving as an etching mask for etching the substrate.

According to a third aspect of the present invention, a method for precision-processing a fine structure includes the steps of: (a) arranging organic molecules on at least a part of a substrate; (b) causing a substance to adhere to a surface of fine particles, the substance having a property to bond with the organic molecules arranged on the substrate; (c) causing the substance to bond with the organic molecules; and (d) etching the substrate by using at least the fine particles as an etching mask.

In the above method, the substance selectively bonds with the organic molecules on the substrate in the step (c), whereby the particles having the substance thereon are arranged and fixed on the substrate. In the step (d), the substrate is etched by using the fine particles arranged on the substrate with the substance interposed therebetween as an etching mask. As a result, fine structures can be formed on the substrate.

According to a fourth aspect of the present invention, a method for precision-processing a fine structure includes the steps of: (a) arranging organic molecules on a substrate, the organic molecules holding no fine particle in their respective holding portions capable of holding a fine particle therein; and (b) immersing the substrate in a liquid having the fine particles dispersed therein to introduce the fine particles into the respective holding portions of the organic molecules.

This enables the fine particles to be effectively arranged on the substrate.

The above method of the fourth aspect of the present invention may further include the step of (c) etching the substrate by using at least the fine particles as an etching mask. Accordingly, the substrate can be etched by using the particles, organic molecules or the like as an etching mask, enabling fine structures to be formed on the substrate.

In the above method of the fourth aspect of the present invention, the organic molecules may be apoferritin. This enables the organic molecules to be arranged and fixed on the substrate with a high density and also enables fine particles with a uniform size to be held in the organic molecules. As a result, uniform, fine structures can be formed with a high density.

In the above method of the fourth aspect of the present invention, a voltage may be applied to the substrate in the step (b). The fine particles are thus electrically attracted toward the substrate, enabling rapid introduction of the fine particles into the holding portions of the organic molecules.

BEST MODE FOR CARRYING OUT THE INVENTION

First Embodiment

The first embodiment is a method for precision-processing a substrate without using a resist film. In this method, ferritin enclosing iron oxide (hereinafter, the term "iron oxide" refers to $Fe_2O_3$) is arranged on the substrate, and at least iron oxide dots in the ferritin are used as a mask. Note that, in every embodiment of the present invention, the term "substrate" refers to the whole substrate including structures formed the substrate such as oxide film and gate electrode.

Figure 1:
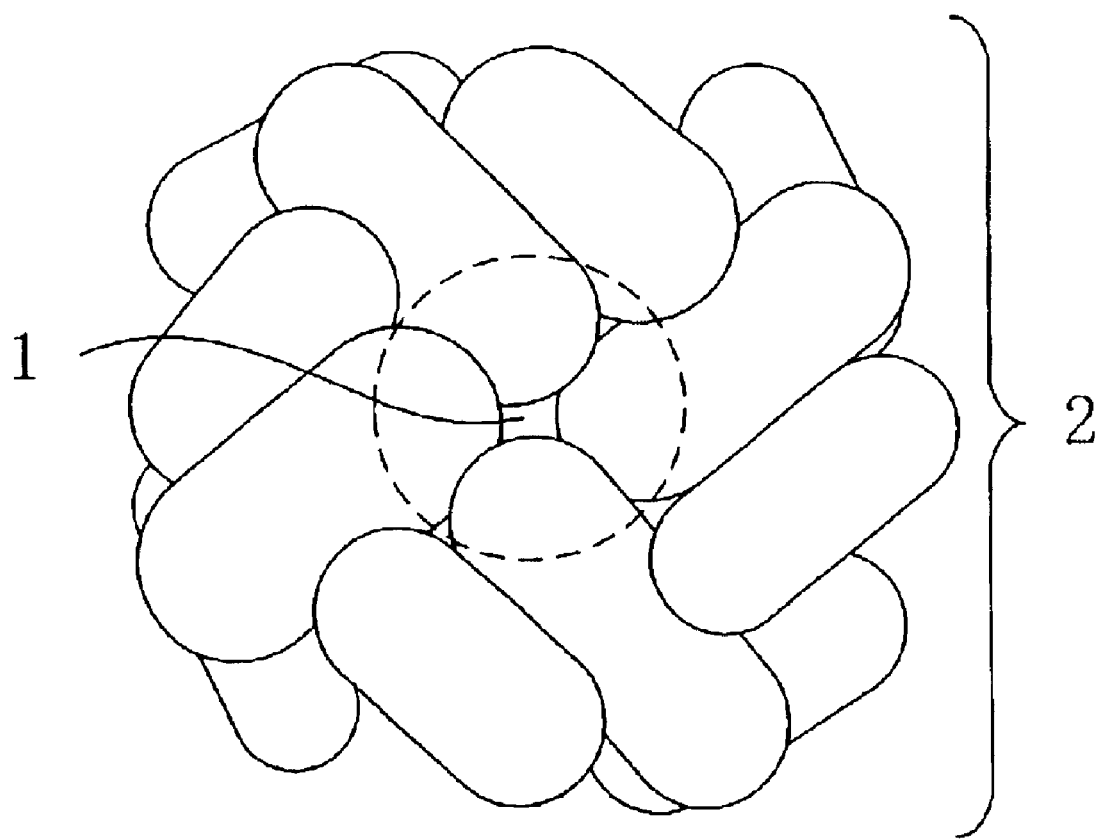
FIG. 1 schematically shows the structure of ferritin.

As schematically shown in FIG. 1, ferritin used herein is a metalloprotein complex formed from a spherical core 1 containing about 3,000 inorganic atoms such as iron, and an outer shell 2 of twenty-four identical subunits enclosing the core 1, and each subunit has a molecular weight of about 20,000. Ferritin is found in, e.g., animal liver and spleen at high level. The outer diameter of ferritin is about 12 nm, and the diameter of the core 1 held therein is about 6 nm. Ferritin excluding the core 1 is called "apoferritin", which includes a holding portion (internal void) for holding the core therein.

The present embodiment is roughly divided into the following three stages: preparing ferritin enclosing iron oxide; two-dimensionally arranging and fixing the ferritin on a substrate; and processing the substrate by using at least iron oxide dots contained in the ferritin as a mask.

A method for introducing iron into apoferritin (ferritin holding no inorganic substance therein) will be described first.

First, a HEPES buffer solution, an apoferritin solution, an iron ammonium sulfate $(Fe(NH_4)_2(SO_4)_2)$ solution are sequentially mixed in this order so that the final concentration is 100 mmol/L (pH 7.0) for the HEPES buffer solution, 0.5 mg/mL for apoferritin, and 5 mmol/L for iron ammonium sulfate. Note that the concentration of iron ammonium sulfate used herein is preferably in the range of 5 to 10 mmol/L, as described below. The operation for preparing ferritin is entirely conducted at room temperature.

As soon as the above solution is prepared, iron ions are oxidized within apoferritin into brown iron oxide. The solution is left at rest overnight in order to complete introduction of the iron ions into apoferritin and oxidation reaction of the iron thus introduced. As a result, iron oxide having a uniform size is introduced into the holding portions of apoferritin, whereby ferritin is produced.

Thereafter, a solution containing the ferritin is put into a container, and centrifuged at 3,000 rpm for 15 to 30 minutes with a centrifugal separator to remove precipitation. After removing the precipitation, the supernatant liquid is further centrifuged at 10,000 rpm for 30 minutes to remove a precipitated aggregate of ferritin.

A solvent in the resultant supernatant liquid, i.e., the 100-mmol/L HEPES buffer solution of pH 7.0, is replaced with a 150-mmol/L NaCl solution. In this step, pH adjustment is not especially required.

The ferritin solution is then concentrated to 1 to 10 mg/mL by dialysis, and $CdSO_4$ is added to the resultant solution so that the final concentration is 10 mmol/L. Ferritin is thus aggregated.

The solution is then centrifuged at 3,000 rpm for 20 minutes to precipitate the ferritin in the solution. The buffer components of the solution are replaced with a 10 to 50-mmol/L Tris buffer solution of pH 8.0 containing 150 mmol/L NaCl by dialysis. The ferritin solution is then concentrated, and ferritin monomers enclosing iron oxide are separated from the ferritin solution by a gel filtration column.

If high-concentration iron ammonium sulfate is added to the ferritin solution as an iron resource in the first stage of this method, by-products would be produced, which inhibit high-purity ferritin enclosing iron oxide from being obtained. It is therefore preferable to use low-concentration iron ammonium sulfate. However, since 0.5-mg/mL apoferritin reacts with 3-mmol/L iron ammonium sulfate, 5-mmol/L iron ammonium sulfate is used in the present embodiment in order to supply a sufficient amount of iron and to prevent side reaction.

Although iron is used as a dot material to be introduced into apoferritin in the present embodiment, a substance serving as an etching mask may be introduced thereinto such as chromium, manganese, cobalt, nickel, aluminum, tungsten, zinc, and oxides and hydroxides thereof. Note that the technology of introducing chromium, manganese, cobalt, nickel, aluminum, tungsten, zinc, and oxides thereof into apoferritin has already been reported, and can be applied to the present invention. For example, in the case of cobalt, inorganic atoms can be introduced into apoferritin by merely adding apoferritin to an ammonium solution of cobalt sulfate, adjusting the pH value to around 8.0, and then adding a small amount of $H_2O_2$ solution. The resultant solution changes from light red to deep green, producing cores of a cobalt compound in the holding portions of apoferritin.

Regarding other embodiments of the present invention as well, an inorganic substance such as chromium, manganese, cobalt, nickel, aluminum, tungsten and zinc may be similarly introduced into the holding portions of apoferritin.

In every embodiment of the present invention, apoferritin may be the one extracted from an animal organ such as equine or bovine spleen and liver. However, apoferritin that is produced within bacteria such as *Escherichia coli* by a genetic engineering method is preferable due to its homogeneity.

In the following embodiments, apoferritin is used to arrange fine particles that serve as a mask for a lithography process or an etching process. However, other proteins capable of holding fine particles therein may be used such as outer shells of viruses such as adenovirus, rotavirus, HK97, CCMV (i.e., viruses excluding genetic materials), proteins of ferritin family such as ferritins, Dps protein and MrgA protein, and bacterial flagellar filament. The bacterial flagellar filament is formed from a protein called flagellin, and can be present in a helical form. Fine particles trapped within the flagellar filament will serve as a columnar mask. These proteins such as ferritins have slightly different structures if they are derived from different species. Therefore, by using these proteins in the present invention, the size of the fine particles to be held therein can be varied. Ferritin derived from any organism may be prepared by the same method as that of the present embodiment.

The core size and the protein diameter are different depending on a protein used. For the Dps protein, the core diameter is 4 nm, the outer shell is a dodecamer of the protein having a regular tetrahedral structure, and the outer diameter is 9 nm. Since the shape of the outer shell varies depending on a protein, the shape of the core also varies depending on a protein. For example, the bacterial flagellar filament is a helical protein having a columnar void therein. Therefore, a bar-shaped core is held therein.

The use of the proteins having different core sizes and core shapes enables formation of fine structures having different shapes.

Alternatively, proteins bonding with a single molecule of a metal such as heme protein bonding with iron and collagenase bonding with zinc, polysaccharides having a property to bond with a metal, and the like may be used in the present invention.

The stage of two-dimensionally arranging and fixing ferritin on the substrate will now be described. The present embodiment is based on the method described in Japanese Laid-Open Publication No. 11-45990.

FIGS. 2(a) to (d) illustrate a method for two-dimensionally arranging and fixing ferritin on the substrate. A buffer solution, pure water and a solution such as a NaCl solution used herein are those having organic substances removed therefrom in advance with an ODS column. As a preparation, a silicon substrate 6 is subjected to an UVasher process (UV ozone process) to remove organic substances from its surface. The resultant silicon substrate 6 is then left at rest for twenty-four hours in 2.5% (v/v) hexamethyldisilazane (HMDS) (($CH_3$)$_3$SiNHSi($CH_3$)$_3$) in order to cover the surface of the silicon substrate 6 with HMDS and thus to make the silicon substrate 6 have a hydrophobic property.

Instead of silicon, glass, SOI or carbon grid may be used as a substrate. When a glass substrate is used, the substrate may be coated with a monomolecular film of nitrogen fluoride in order to make the substrate have a hydrophobic property.

First, in the step of FIG. 2($a$), 2 to 3 $\mu$L of 0.6 mg/mL PBLH (Poly-1-Benzyl-L-histidine) is dropped to the surface of a buffer solution containing dispersion of ferritin 4 enclosing iron oxide ($Fe_2O_3$) (e.g., a 20-mmol/L phosphate buffer solution of pH 5.8 containing 60-$\mu$g/mL ferritin, 20-mmol/L sodium chloride, and 5 to 10-mmol/L $MgCl_2$ or $CaCl_2$) (hereinafter, referred to as solution 3). The resultant solution is then left at room temperature for 2.5 hours. As a result, a PBLH film 5 is formed at the surface of the solution.

In the step of FIG. 2($b$), the solution 3 is raised to 38° C. and left for one hour. The solution 3 is then left for two hours at room temperature. The PBLH film 5 is positively charged, while the ferritin 4 is negatively charged at pH 5 or more. Therefore, the ferritin 4 adheres to the PBLH film 5 with time, and a two-dimensional crystalline film of the ferritin 4 is formed on the PBLH film 5.

In the step of FIG. 2($c$), the silicon substrate 6 is slowly placed on the PBLH film 5 and held for one minute at room temperature to transfer the PBLH film 5 and the two-dimensional crystalline film of the ferritin 4 onto the silicon substrate 6.

Note that, since the PBLH film 5 has a hydrophobic property, forming hydrophobic and hydrophilic regions of a prescribed pattern at the surface of the silicon substrate 6 enables the two-dimensional crystalline film of a desired pattern to be transferred onto the silicon substrate 6 in the step of FIG. 2($c$). The process of forming the hydrophilic region in the silicon substrate 6 can be conducted by making ozone generated by ultraviolet radiation in contact with a part of the substrate.

In the step of FIG. 2($d$), the silicon substrate 6 is separated from the surface of the solution 3 and dried. The two-dimensional crystalline film of the ferritin 4 is thus arranged and fixed on the silicon substrate 6.

The ferritin 4 has a diameter of 12 nm, and the core 1 enclosed therein has a diameter of about 6 nm. Moreover, the holding portion is located at a fixed position in the ferritin. Therefore, the method of the present embodiment enables patterning of a fine structure of nanometer size that is beyond the limit of the conventional lithography technology.

Hereinafter, the stage of processing the silicon substrate 6 will be described with reference to FIGS. 9($a$) to ($c$).

Figure 9A:
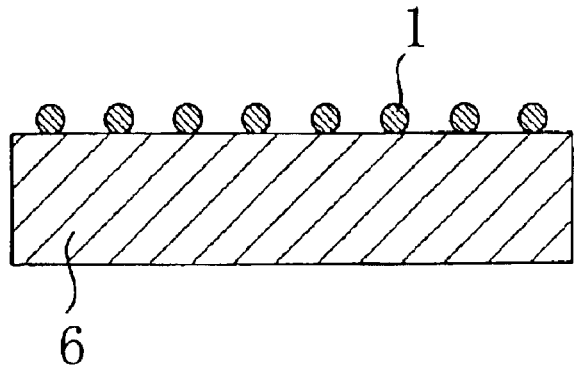
FIGS. 9(a) to (c) are cross-sectional views illustrating the step of patterning a fine structure without using a resist film according to the first embodiment.
Figure 9B:
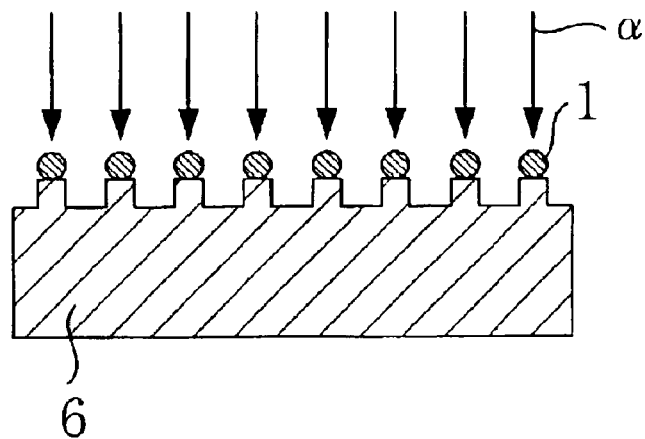
Figure 9C:
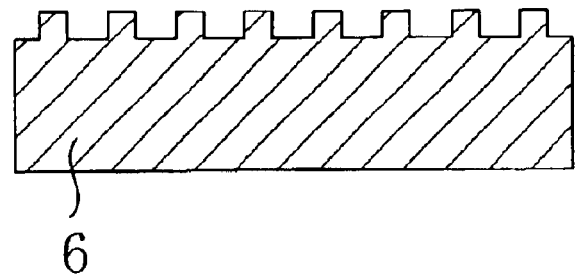

In the step of FIG. 9($a$), before an RIE process, the surface of the silicon substrate 6 having the ferritin arranged thereon is processed in a nitrogen-gas atmosphere at 450° C. for one hour to remove the protein outer shells 2. As a result, only the iron oxide cores 1 are left on the silicon substrate 6. The step of removing the outer shells 2 may be omitted. However, removing the protein portion of the ferritin 4 allows the cores 1 to be arranged in good order on the silicon substrate 6. More effective patterning can be achieved by the following etching process.

The outer shells 2 may alternatively be removed by ozonolysis or chemical decomposition using cyanogen bromide (CNBr).

The silicon substrate 6 may then be processed in a reducing-gas atmosphere such as hydrogen at 400 to 500° C. for about one hour in order to reduce iron oxide of the cores 1 to iron atoms. This reduces the volume of the cores 1, enabling formation of a finer pattern.

When the outer shells 2 of the ferritin 4 are not removed, the silicon substrate 6 having the ferritin 4 arranged thereon is subjected to reactive ion etching (RIE) for about ten minutes by using $SF_6$ gas in the step of FIG. 9($b$). The outer shells 2 and the silicon substrate 4 are thus selectively removed. When the outer shells 2 were removed first, the reactive RIE is conducted for five minutes to selectively remove the silicon substrate 6. This is because the cores 1 are less susceptible to etching as compared to the silicon substrate 1 and the outer shells 2.

It should be noted that, when a shallow fine structure is to be formed, the RIE may be conducted for a short time (within several minutes) without removing the outer shells 2, in order to use the outer shells 2 as a mask.

In the step of FIG. 9($c$), as the etching proceeds, the cores 2 are finally etched away, whereby the silicon substrate 6 of a desired pattern is left. The present embodiment thus enables fine patterning to be conducted with accuracy.

Note that, in the present embodiment, the RIE using $SF_6$ is conducted as a means for patterning the substrate. However, radiation $\alpha$ capable of selectively removing the substrate may alternatively be directed such as X-rays, electron beams, plasma or corpuscular rays.

In every embodiment of the present invention, various proteins capable of enclosing fine particles that serve as a mask in the lithography and etching processes can be used instead of ferritin. However, ferritins or Dps protein, MrgA protein, bacterial flagellar filament, outer shells of various viruses and the like can be mass-produced by a genetic engineering method. Therefore, the use of these proteins enables mass production of fine structures on an industrial basis.

Figure 11:
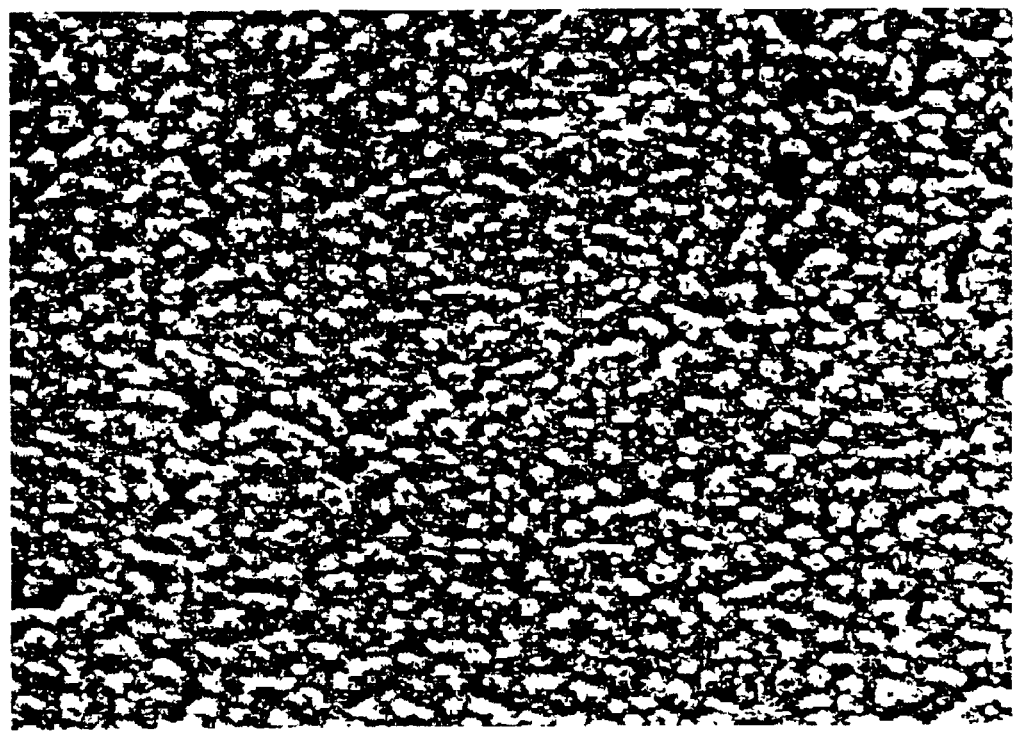
FIG. 11 is a scanning electron microscope image of fine columns formed by a method for processing a fine structure according to the present invention.

FIG. 11 is a scanning electron microscope image of the substrate surface after the silicon substrate 6 having the ferritin 4 densely arranged two-dimensionally is processed by the method of the present embodiment. This image shows that columnar structures (hereinafter, referred to as fine columns) are formed on the silicon substrate 6 along the pattern of the cores 1 arranged on the silicon substrate 6.

Since the cores 1 of the ferritin used in the present embodiment have a diameter of 6 nm, the fine columns formed on the silicon substrate 6 have a diameter of 6 nm at their top ends. Moreover, a protein such as ferritin used in the present invention holds uniformly sized fine particles of several nanometers in diameter. Therefore, the present invention enables formation of fine structures with a uniform size (i.e., precision processing of fine structures) which cannot heretofore be implemented.

Note that, by using the fine columns of about 6 nm in diameter formed by the present embodiment, fine light-emitting elements shown in the third embodiment below can be formed at high density.

Second Embodiment

The second embodiment is a method for arranging ferritin enclosing iron oxide onto a substrate having a resist film thereon, patterning the resist film by using at least iron oxide dots within the ferritin as a mask, and etching the substrate using the resist film pattern as a mask.

First, ferritin enclosing iron oxide is prepared by the same method as that of the first embodiment.

FIGS. 2(a) to (d) illustrate a method for two-dimensionally arranging and fixing ferritin on the substrate.

A buffer solution, pure water and a solution such as a NaCl solution used herein are those having organic substances removed therefrom in advance with an ODS column.

As a preparation, a material such as calix arene, a positive resist, is formed with a thickness of 10 nm on a silicon substrate to be used. Another positive resist such as polymethyl methacrylate (PMMA), α-methylstyrene resin and novolak may be used instead of calix arene. A negative resist may be used. However, a negative resist is problematic in terms of etching accuracy. Therefore, a positive resist is preferred. The resist film may be formed either by applying a resist material directly on the substrate or by forming a film of a resist material first and then laminating the film on the substrate. The thickness of the resist film is not specifically limited.

Figure 2A:
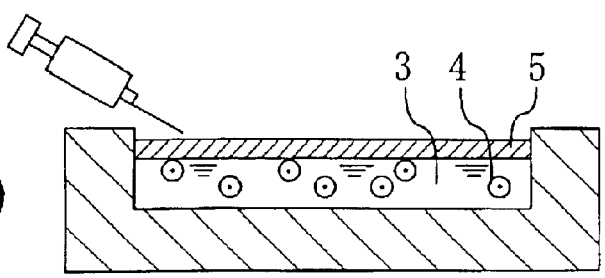
FIGS. 2(a) to (d) illustrate a method for two-dimensionally arranging and fixing ferritin on a substrate according to first and second embodiments.

Like the first embodiment, in the step of FIG. 2(a), 2 to 3 μL of 0.6 mg/mL PBLH is first dropped to the surface of a buffer solution containing dispersion of ferritin 4 enclosing iron oxide (e.g., a 20-mmol/L phosphate buffer solution of pH 5.8 containing 60-μg/mL ferritin, 20-mmol/L sodium chloride, and 5 to 10-mmol/L $MgCl_2$ or $CaCl_2$) (solution 3). The resultant solution is then left at room temperature for 2.5 hours. As a result, a PBLH film 5 is formed at the surface of the solution.

Figure 2B:
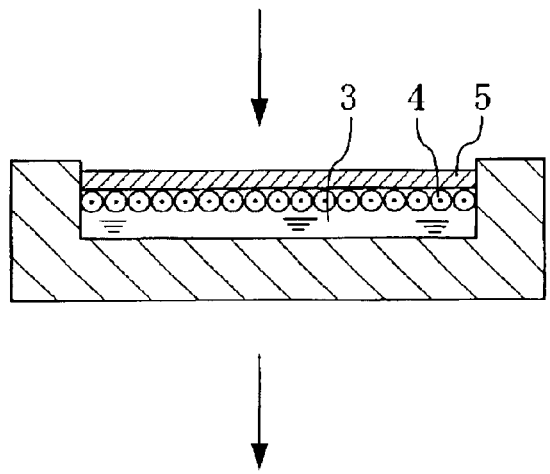

In the step of FIG. 2(b), the solution is raised to 38° C. and left for one hour. The solution 3 is then left for two hours at room temperature. The PBLH film 5 is positively charged, while the ferritin 4 is negatively charged. Therefore, the ferritin 4 adheres to the PBLH film 5 with time, and a two-dimensional crystalline film of the ferritin 4 is formed on the PBLH film 5.

Figure 2C:
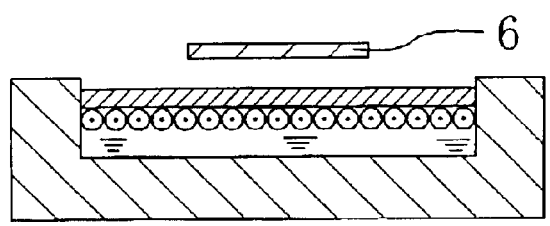

In the step of FIG. 2(c), the silicon substrate 6 having the resist film 13 formed thereon is slowly placed on the PBLH film 5 such that the resist film faces the PBLH film 5. The silicon substrate 6 is thus held for one minute at room temperature to transfer the PBLH film 5 and the two-dimensional crystalline film of the ferritin 4 onto the silicon substrate 6. Since the resist film 13 on the silicon substrate has a hydrophobic property, the ferritin 4 is rapidly transferred onto the surface of the resist film 13 on the silicon substrate 6. Forming a hydrophilic region of a prescribed pattern at the surface of the resist film 13 on the silicon substrate 6 enables the two-dimensional crystalline film of a desired pattern to be transferred onto the silicon substrate 6. The process of forming the hydrophilic region in the resist film 13 is conducted by making ozone generated by ultraviolet radiation in contact with a part of the substrate.

Alternatively, a positively or negatively charged substance may be bonded to the surface of the resist film 13 in order to form a desired pattern by the charge difference.

For example, ferritin is negatively charged when the solution has a pH value of 5.0 or more. Therefore, processing the substrate with a substance that is positively charged at pH 11 or less such as aminosilane enables the ferritin to be transferred onto the resist film 13 at pH 5 to pH 11.

Figure 2D:
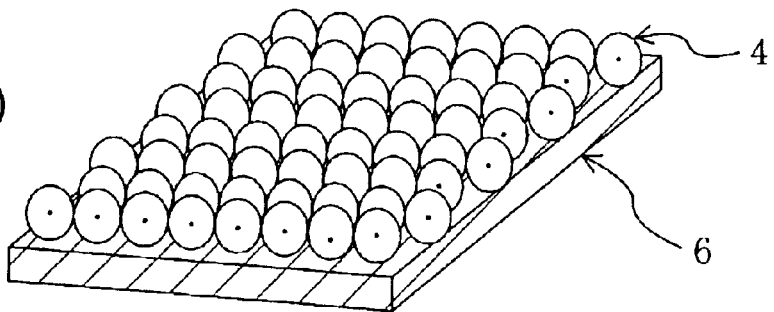

In the step of FIG. 2(d), the silicon substrate 6 is separated from the surface of the solution 3 and dried. The two-dimensional crystalline film of the ferritin 4 is thus arranged and fixed on the resist film 13.

The ferritin has a diameter of 12 nm, and the core 1 enclosed therein has a diameter of about 6 nm. The holding portion is located at a fixed position in the ferritin. Therefore, the present embodiment using the cores 1 as a mask enables a fine structure of nanometer size to be patterned with highly improved accuracy over the conventional lithography technology.

Hereinafter, the stage of processing the silicon substrate 6 will be described with reference to FIGS. 10(a) to (d).

Figure 10A:
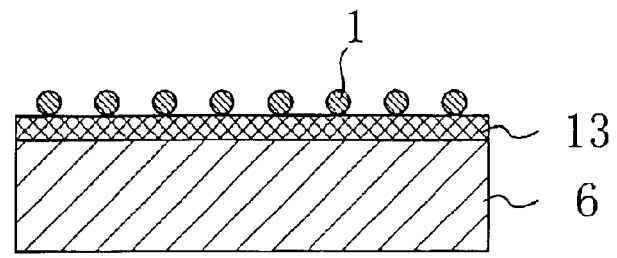
FIGS. 10(a) to (d) are cross-sectional views illustrating the step of patterning a fine structure by using a resist film according to the second embodiment.

In the step of FIG. 10(a), before an RIE process, the surface of the silicon substrate 6 having the ferritin 4 arranged thereon is chemically decomposed with cyanogen bromide (CNBr) to remove the protein outer shells 2. As a result, only the iron oxide cores 1 are left on the resist film 13 of the silicon substrate 6. The step of removing the outer shells 2 may be omitted to conduct a lithography process by using the outer shells 2 as a mask. However, removing the protein portion of the ferritin 4 allows the cores 1 to be arranged in good order on the silicon substrate 6. The outer shells 2 may alternatively be removed by ozonolysis, and if the resist film 13 has heat resistance, by thermal decomposition of processing the substrate in a nitrogen-gas atmosphere at 450° C. for one hour.

The silicon substrate 6 may then be processed in a reducing-gas atmosphere such as hydrogen at 400 to 500° C. for about one hour in order to reduce iron oxide of the core 1 to iron atoms. This reduces the volume of the cores 1, enabling formation of a finer pattern in later steps.

Figure 10B:
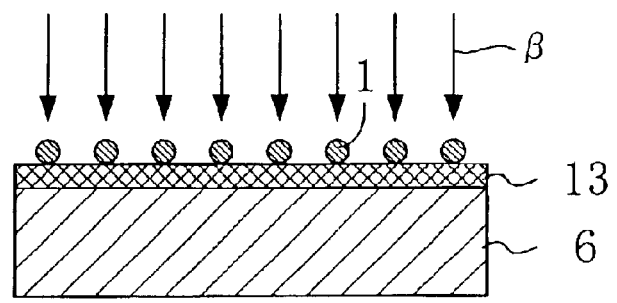

In the step of FIG. 10(b), radiation β such as electron beams or X-rays is directed downward onto the silicon substrate 6. The cores 1 on the resist film 13 serve as a mask, and the resist film 13 on the silicon substrate 6 is modified into a removable film except for the regions right under the cores 1.

Figure 10C:
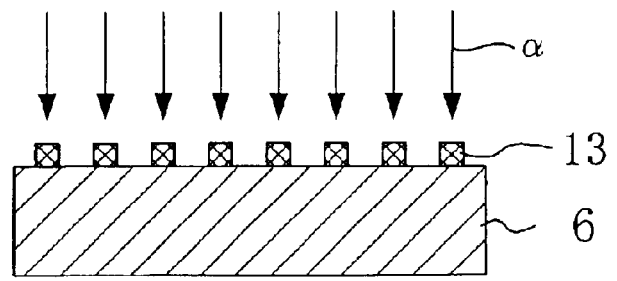

In the step of FIG. 10(c), the surface of the silicon substrate 6 is washed to remove the cores 1 and the modified resist film from the silicon substrate 6. An unmodified resist film 13 is thus left thereon.

Figure 10D:
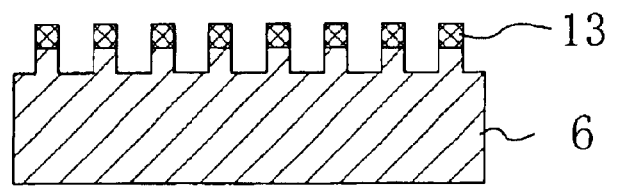

In the step of FIG. 10(d), RIE using $SF_6$ is conducted by using the resist film 13a left on the silicon substrate 6 as a mask, until a desired structure is obtained.

Note that, in the present embodiment, the RIE using $SF_6$ is conducted as a means for patterning the substrate. However, radiation α capable of removing the substrate may alternatively be directed such as X-rays, electron beams, plasma or corpuscular rays.

The remaining resist film 13 is then washed away with an appropriate means.

The present embodiment also enables accurate formation of a fine pattern of nanometer size. In other words, the present embodiment enables formation of fine structures with a uniform size (i.e., precision processing of fine structures) which cannot be implemented with the conventional lithography technology.

Third Embodiment

In the third embodiment, the method for manufacturing an optical semiconductor device described in Eriguchi, et al., Japanese Laid-Open Publication No. 8-083940 will be described using the fine columns formed by the method for precision-processing a fine structure according to the present invention.

Figure 12:
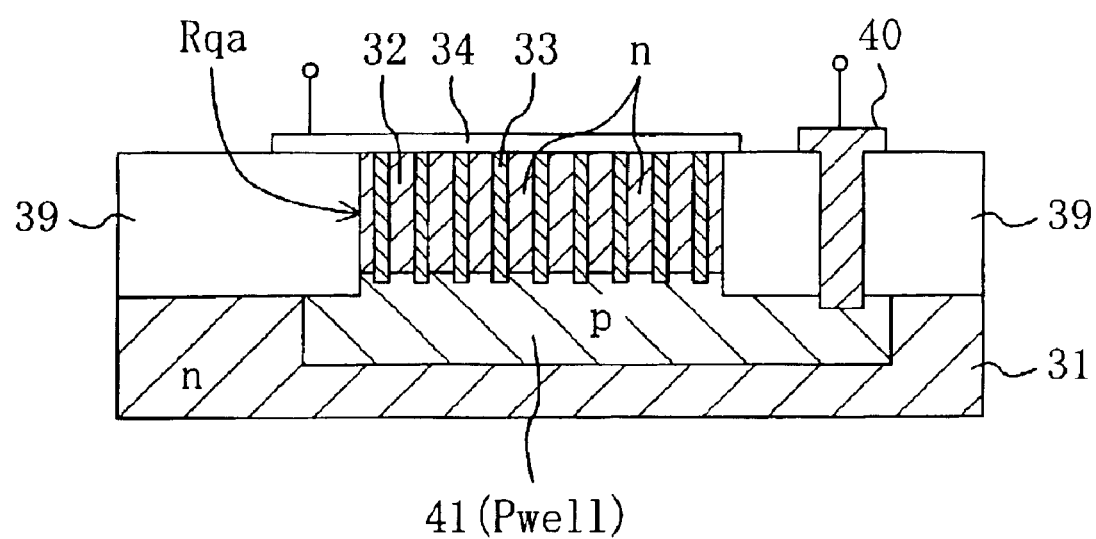
FIG. 12 is a cross-sectional view of an optical semiconductor device using fine columns formed by a method for processing a fine structure according to the present invention.

FIG. 12 is a cross-sectional view of an optical semiconductor device using fine semiconductor columns of 6 nm in diameter formed by the first or second embodiment.

In the first and second embodiments, n-type silicon having a p-well 41 formed therein and an n-well formed on the p-well 41 is used as a substrate. The substrate is etched to a depth within the p-well 41, whereby fine semiconductor columns 32 of n-type silicon are densely formed perpendicularly to the substrate surface.

The side surfaces of the fine semiconductor columns are then covered with an insulating layer 33 of a silicon oxide film by a thermal oxidation method. Thereafter, the gaps between the fine semiconductor columns 32 are filled with the insulating layer 33, and the top surface thereof is planarized.

The insulating layer 33 located on the planarized ends of the fine semiconductor columns 32 is removed, and a transparent electrode 34 is formed thereon.

Note that an insulating isolation layer 39 is formed in advance on both sides of a quantized region Rqa on the silicon substrate 31 in order to separate the quantized region from other regions. A side electrode 40 extending through the insulating isolation layer 39 is also formed in advance so as to be connected to the silicon substrate 31 that serves as a lower electrode with respect to the transparent electrode 34 serving as an upper electrode of the fine semiconductor columns 32.

The optical semiconductor device is thus formed. By applying a forward voltage between the transparent electrode 34 and the side electrode 40, electroluminescence is produced at room temperature. Moreover, changing a carrier injection voltage produces electroluminescence of visible light corresponding red, blue and yellow light emission.

The fine semiconductor columns formed by the present embodiment have an approximately uniform size. This reduces variation in emission wavelength, resulting in a steeper emission spectrum. In other words, a certain wavelength is emitted at a high intensity. The fine semiconductor columns in the optical semiconductor devices currently used in the practical applications have a diameter of 20 to 30 nm. However, the fine semiconductor columns in the present embodiment have a significantly reduced diameter of 6 nm. This enables implementation of an optical semiconductor device having high emission efficiency, which is heretofore difficult.

Other Embodiments

Hereinafter, other embodiments of the method for two-dimensionally arranging and fixing a protein such as ferritin on the substrate will be described.

Ferritin used herein is prepared by the same method as that of the first and second embodiments.

Figure 3A:
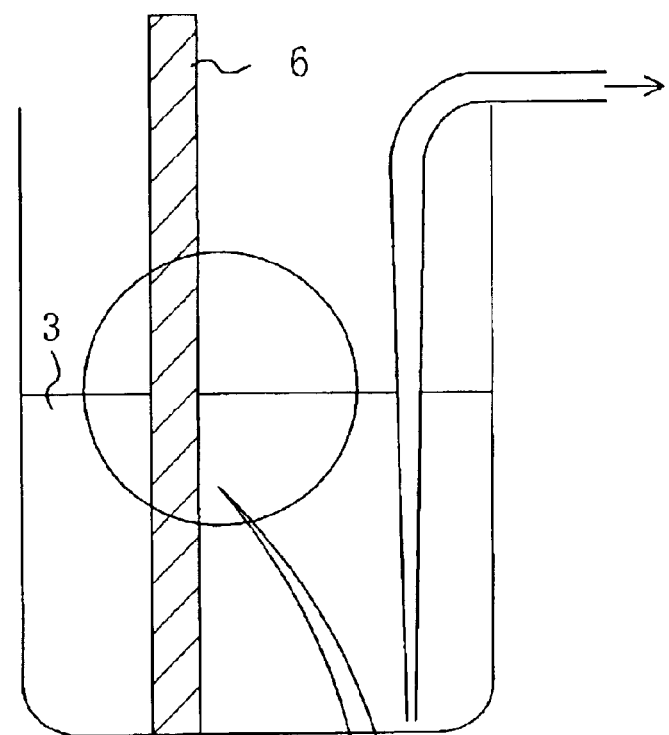
FIGS. 3(a) and (b) are cross-sectional views illustrating a first specific example of the method for two-dimensionally arranging and fixing ferritin.
Figure 3B:
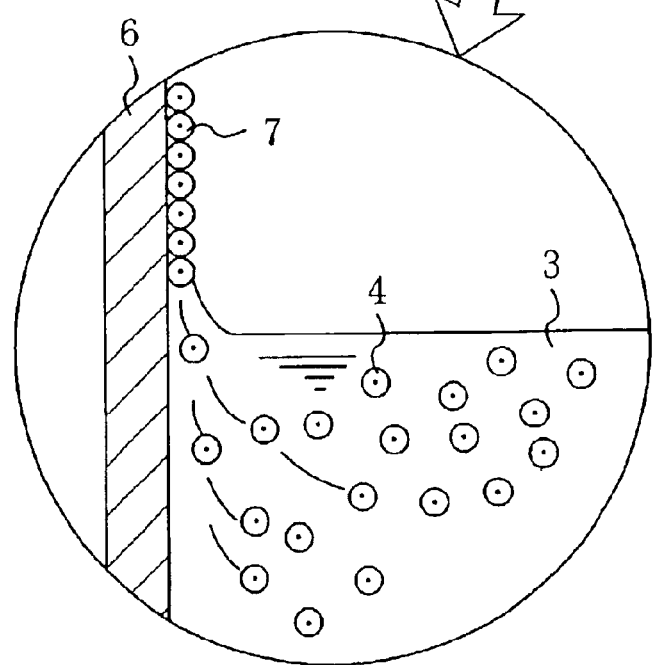

As a first specific example, the method disclosed in Japanese Patent Application No. 2000-086116 can be used in the present invention (see FIGS. 3(a) to (b)).

As shown in FIG. 3(a), a container having an outlet port is filled with a buffer solution containing dispersion of ferritin 4 enclosing iron oxide (e.g., a 20-mmol/L phosphate buffer solution of pH 5.8 containing 60-$\mu$pg/mL ferritin, 20-mmol/L sodium chloride, and 5 to 10-mmol/L $MgCl_2$ or $CaCl_2$) (hereinafter, referred to as solution 3).

The silicon substrate 6 is then put into the solution 3 in the direction perpendicular to the surface of the solution 3, and the solution 3 is gradually removed through the outlet port so that the liquid level falls at 0.1 mm/min. Since magnesium or calcium ions in the solution 3 combine the ferritin molecules together, a wet film 7 having the ferritin 4 dispersed therein is formed on both surfaces of the silicon substrate 6. The solution 3 contains the calcium ions or magnesium ions at 1 to 20 mmol/L, and preferably, 5 to 10 mmol/L. The solution 3 may contain cadmium ions at 1 to 20 mmol/L, and preferably 5 to 10 mmol/L, instead of the calcium ions or magnesium ions.

Figure 4:
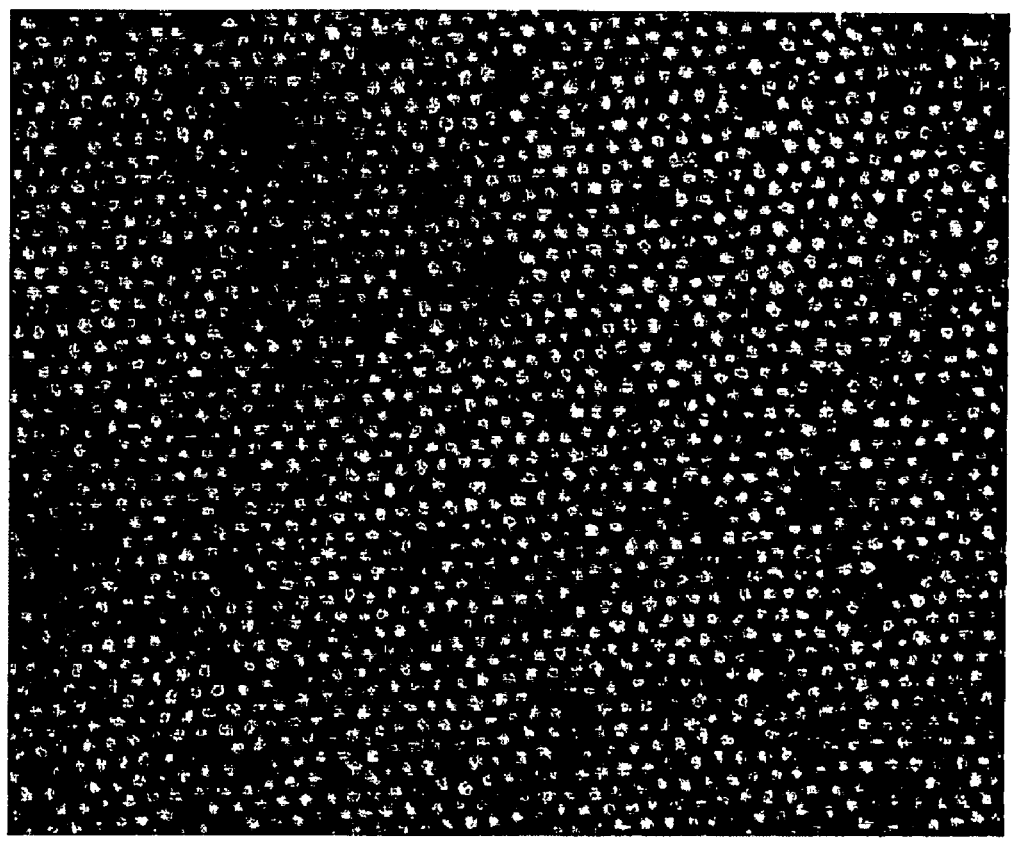
FIG. 4 shows a scanning electron microscope image of a two-dimensional crystalline film of ferritin that is arranged and fixed on the substrate by the method of FIG. 3.

The silicon substrate 6 is then dried, whereby a two-dimensional crystalline film having the ferritin molecules arranged with the same orientation with hexagonal symmetry is formed on the silicon substrate 6, as shown in FIG. 4. FIG. 4 shows a scanning electron microscope image of the two-dimensional crystalline film of the ferritin aligned on the substrate.

According to the present embodiment, a plurality of substrates can be processed at a time, enabling efficient production of the silicon substrate 6 having a two-dimensional crystalline film on its surface.

Note that a desired pattern need be formed in advance on the surface of the silicon substrate 6 used in the present embodiment. This is conducted by combination of processes such as a process of forming a hydrophilic region in the substrate by making ozone generated by ultraviolet radiation in contact with a part of the substrate and a process of making the substrate have a hydrophobic property by using HMDS. As shown in FIG. 3(b), the ferritin 4 is selectively arranged on the silicon substrate 6 having a hydrophobic property.

A positively or negatively charged substance may alternatively be bonded to the surface of the silicon substrate 6 in order to form a desired pattern by the charge difference.

Precision processing of an ultrafine structure of nanometer size is then achieved by the same process as that in the first and second embodiments. According to the present embodiment, ferritin can be arranged on the substrate with the same crystal orientation, and molecules are less likely to be separated from the substrate in the formation of the ferritin on the substrate. As a result, a dense two-dimensional crystalline film of ferritin is obtained, enabling improved patterning accuracy of a fine structure. Accordingly, fine light-emitting elements, for example, can be aligned with improved density over the first and second embodiments.

Figure 5:
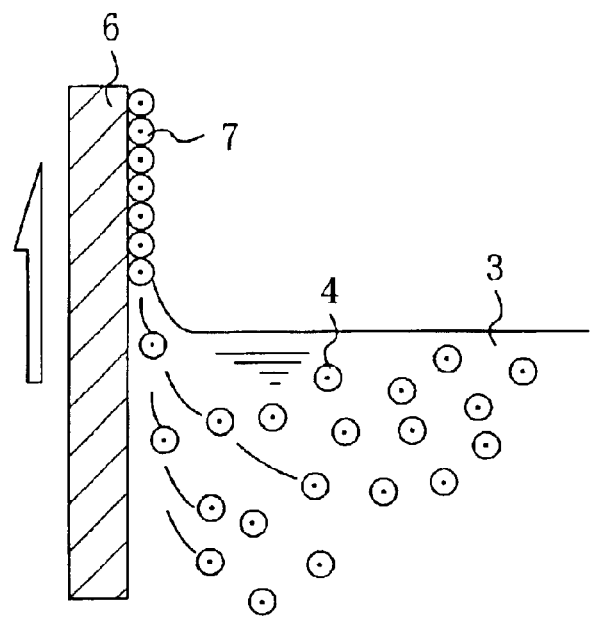
FIG. 5 is a cross-sectional view illustrating a second specific example of the method for two-dimensionally arranging and fixing ferritin.

As a second specific example, a substrate having ferritin two-dimensionally arranged and fixed thereon can be produced by the following method:

AS shown in FIG. 5, the silicon substrate 6 is put into the solution 3 having the ferritin 4 dispersed therein in the direction perpendicular to the surface of the solution 3. The silicon substrate 6 is then gradually take out of the solution 3 in the direction perpendicular to the surface of the solution 3. A wet film 7 having the ferritin 4 dispersed therein is thus formed on both surfaces of the silicon substrate 6. The silicon substrate 6 is then dried, whereby a two-dimensional crystalline film having the ferritin 4 arranged with the same crystal orientation with hexagonal symmetry (hexagon) is formed on the silicon substrate 6.

Alternatively, as a third specific example, a substrate having ferritin two-dimensionally arranged and fixed thereon can also be produced by the method reported by Nagayama, et al. (Lanbgmuir, Vol. 12, 1836–1839, 1996).

Figure 6:
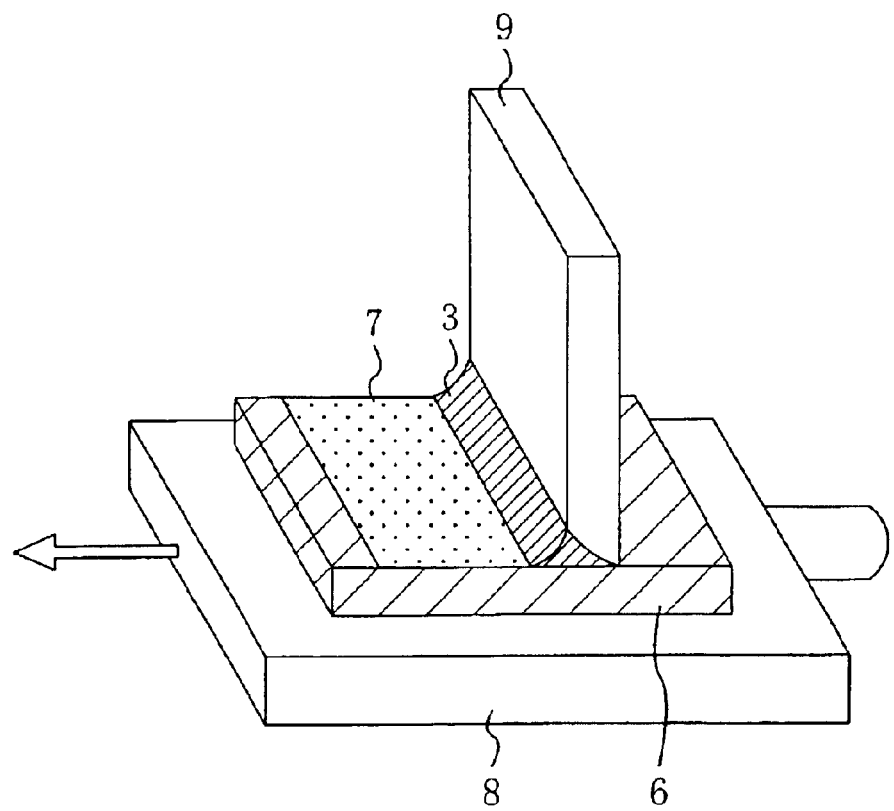
FIG. 6 is a cross-sectional view illustrating a third specific example of the method for two-dimensionally arranging and fixing ferritin.

More specifically, as shown in FIG. 6, a platinum blade 9 is placed on the silicon substrate 6 on a mount 8 so as to extend perpendicularly to the substrate. The solution 3 having ferritin 4 dispersed therein is dropped between the silicon substrate 6 and the platinum blade 9.

With the platinum blade 9 being fixed, the mount 8 is moved at a fixed speed in the direction perpendicular to the surface of the platinum blade 9 toward the surface of the platinum blade 9 having the solution 3 accumulated thereon (i.e., in the direction shown by arrow in FIG. 6). Since the silicon substrate 6 moves together with the mount 8, a wet film 7 having the ferritin 4 dispersed therein is formed from the solution 3 on the silicon substrate 6. The silicon substrate 6 is then dried, whereby a two-dimensional crystalline film of ferritin 4 is formed on the silicon substrate 6.

Alternatively, as a fourth specific example, a substrate having ferritin two-dimensionally arranged and fixed thereon can also be produced by the transfer method developed by Yoshimura, et al. (Adv. Biophys. Vol. 34, pp. 93–107, 1997) as shown in FIGS. 7(a) to (d).

Figure 7A:
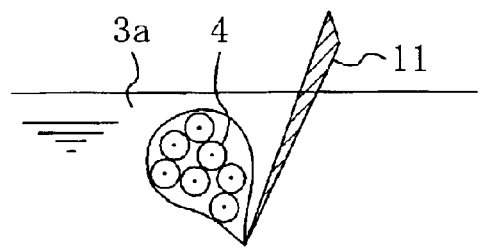
FIGS. 7(a) to 7(d) is a cross-sectional view illustrating a fourth specific example of the method for two-dimensionally arranging and fixing ferritin.

In FIG. 7(a), ferritin 4 enclosing iron oxide is injected into a 2% sucrose solution 3a with a syringe 11.

Figure 7B:
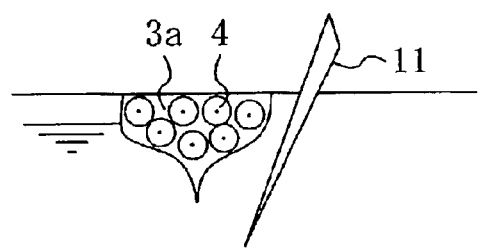

As shown in FIG. 7(b), the ferritin 4 floats up to the surface of the sucrose solution 3a.

Figure 7C:
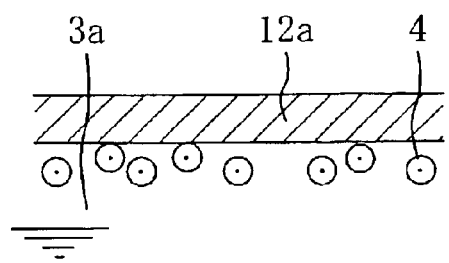
Figure 7D:
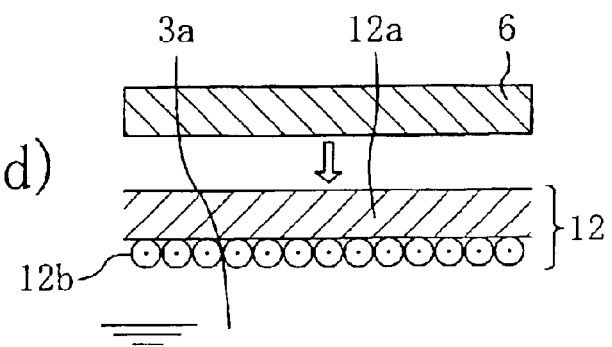

As shown in FIG. 7(c), the ferritin 4 reaching the gas-liquid interface first is modified by the surface tension of the sucrose solution 3a, forming an amorphous film 12a of a protein portion having no iron oxide. The ferritin 4 reaching the surface of the solution later adheres to the lower surface of the amorphous film 12a, forming a two-dimensional crystalline film 12b under the amorphous film 12a, as shown in FIG. 7(d).

By placing the silicon substrate 6 on a film 12 of the amorphous film 12a and the two-dimensional ferritin crystals 12b, the film 12 is transferred onto the silicon substrate 6. Note that, instead of the silicon substrate, a glass substrate, carbon grid or the like may be used as a substrate. The film 12 can be easily transferred onto the silicon substrate 6 if the silicon substrate 6 is made to have a hydrophobic property as in the first and third embodiments. Therefore, forming a prescribed hydrophobic pattern in the silicon substrate 6 enables the film 12 of a desired pattern to be transferred onto the silicon substrate 6.

As a fifth specific example, the method for arranging and fixing fine particles on a silicon substrate without using ferritin as described in Morita, et al., Japanese Laid-Open Publication No. 11-233752 will now be described.

FIGS. 8(a) to (d) are cross-sectional views illustrating the method for arranging and fixing fine metal particles on a silicon substrate 21 by using an antigen-antibody reaction.

Figure 8A:
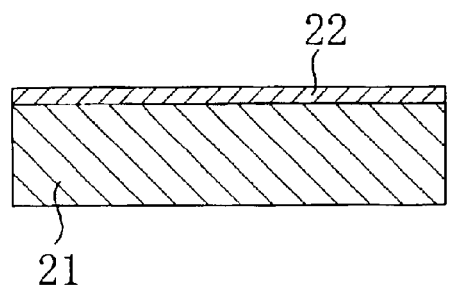
FIGS. 8(a) to (d) are cross-sectional views illustrating a method for arranging and fixing fine particles on a substrate by using an antigen-antibody reaction.

In the step of FIG. 8(a), a Rat IgG antibody film 22 is formed on a p-type silicon substrate 21 by, e.g., spin-coating a thin acetyl cellulose film including Rat IgG antibodies.

Figure 8B:
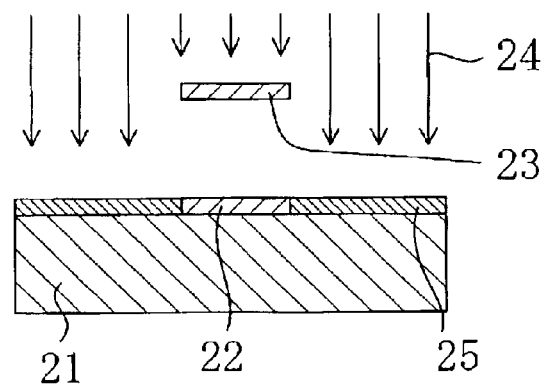

In the step of FIG. 8(b), a photomask 23 is prepared to partially shield the p-type silicon substrate 21. By using the photomask 23, ultraviolet rays 24 are selectively radiated to the Rat IgG antibody film 22 except for the shielded part. The part of the Rat IgG antibody film 22 exposed to the ultraviolet radiation 24 loses its activity as an antibody, and changes into an inactive Rat IgG antibody film 25. On the other hand, the part of the Rat IgG antibody film 22 shielded from the ultraviolet radiation 24 by the photomask 23 retains its activity as an antibody.

Note that this step may be omitted if the fine columns are formed at a high density as in the third embodiment.

Figure 8C:
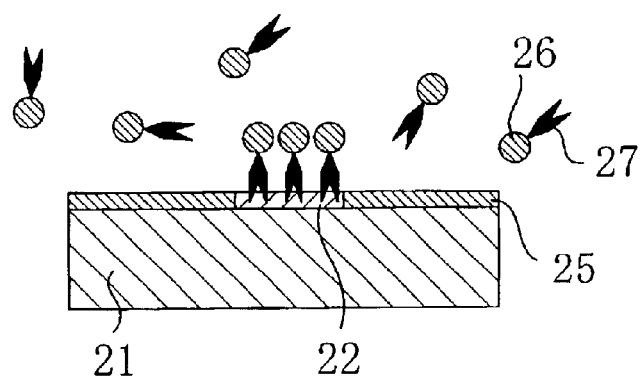

In the step of FIG. 8(c), a solution containing fine metal particles 26 bonding with Rat IgG antigens 27 is prepared. The p-type silicon substrate 21 having the Rat IgG antibody film 22 thereon is immersed in the solution for five to ten hours (a container is not shown). As a result, the Rat IgG antigens 27 bonding with the fine metal particles 26 selectively bond with the Rat IgG antibody film 22 on the p-type silicon substrate 21. The Rat IgG antigens 27 bonding with the fine metal particles 26 are thus fixed on the Rat IgG antibody film 22. On the other hand, since the inactive Rat IgG antibody film 25 no longer has the activity as an antibody as a result of ultraviolet radiation, no Rat IgG antigen 27 is fixed on the inactive Rat IgG antibody film 25. Accordingly, the Rat IgG antigens 27 bonding with the fine metal particles 26 are fixed only on the Rat IgG antibody film 22 on the p-type silicon substrate 21.

Figure 8D:
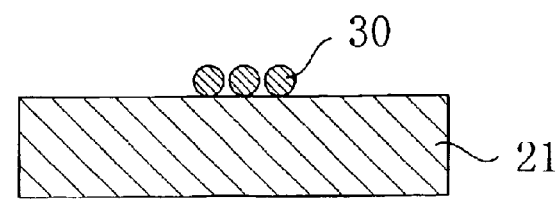

In the step of FIG. 8(d), the p-type silicon substrate 21 is placed in oxygen plasma for twenty minutes. As a result, the Rat IgG antibody film 22, the inactive Rat IgG antibody film 25 and the Rat IgG antigens 27 on the p-type silicon substrate 21 are entirely decomposed by the oxygen plasma. In other words, the Rat IgG antibody film 22 and the Rat IgG antigens 27 present between the fine metal particles 26 and the p-type silicon substrate 21 are decomposed away. As a result, fine-metal-particle dots 30 having a desired size are formed at a desired position on the p-type silicon substrate 21.

According to the method of the present embodiment, the fine metal particles having a uniform particle size can be used which have already been formed as fine particles by another means. This enables accurate size control of the dots 30. Moreover, since the antigens bond with the antibodies with strong selectivity, the dots can be formed only at a desired position.

In the present embodiment, the Rat IgG antibody film is formed on the substrate and the Rat IgG antigens bonding with the fine metal particles are used. However, the antigens and the antibodies may be reversed. In other words, antigens may be formed on the substrate and fine particles may be modified with antibodies.

An example using apoferritin will now be described as a sixth specific example.

First, a two-dimensional crystalline film of apoferritin is formed on a substrate by the method described in the other embodiments.

The substrate having the two-dimensional crystalline film of apoferritin thereon is then immersed in a solution containing fine particles of a metal or the like, in order to introduce the fine particles into apoferritin on the substrate surface. For example, a negative voltage may be applied to the substrate to attract the fine particles and efficiently introduce them to apoferritin. However, the applied voltage must be adjusted so as not to electrolyze the solution.

Instead of applying a voltage to the substrate, an electric field of about 1 MHz may be applied to the substrate surface serving as an electrode, in order to collect the fine particles onto the substrate surface by using the Dielectric phoresis: DEP) effect.

This method also enables a two-dimensional crystalline film of ferritin to be formed on the substrate.

INDUSTRIAL APPLICABILITY

A method for precision-processing a fine structure according to the present invention is utilized in manufacturing of a semiconductor light-emitting element and various semiconductor devices using a quantum effect.

What is claimed is:

1. A method for precision-processing a fine structure, comprising the steps of:

(a) forming a resist film on a substrate;

(b) arranging organic molecules on the resist film on the substrate, the organic molecules each holding a fine particle in a holding portion capable of holding a fine particle therein;

(c) patterning the resist film by using at least the fine particles as a mast to form a resist pattern; and (d) etching the substrate by using the resist pattern as a mask.

* * * * *